United States Patent
Kang et al.

(10) Patent No.: US 11,672,164 B2
(45) Date of Patent: Jun. 6, 2023

(54) DISPLAY APPARATUS WITH DOPED BARRIER AND CONDUCTIVE LAYERS AND METHOD OF MANUFACTURING THE SAME

(71) Applicant: Samsung Display Co., Ltd., Yongin-si (KR)

(72) Inventors: Minkyung Kang, Yongin-si (KR); Byungsoo So, Yongin-si (KR); Jaewoo Jeong, Yongin-si (KR); Jongjun Baek, Yongin-si (KR); Hiroshi Okumura, Yongin-si (KR)

(73) Assignee: SAMSUNG DISPLAY CO., LTD., Yongin-Si (KR)

( * ) Notice: Subject to any disclaimer, the term of this patent is extended or adjusted under 35 U.S.C. 154(b) by 174 days.

(21) Appl. No.: 17/077,648

(22) Filed: Oct. 22, 2020

(65) Prior Publication Data

US 2021/0320268 A1 Oct. 14, 2021

(30) Foreign Application Priority Data

Apr. 9, 2020 (KR) .................. 10-2020-0043605

(51) Int. Cl.
*H01L 51/00* (2006.01)
*H01L 27/32* (2006.01)
*H01L 51/56* (2006.01)

(52) U.S. Cl.
CPC ...... *H01L 51/0097* (2013.01); *H01L 27/3244* (2013.01); *H01L 51/56* (2013.01); *H01L 2251/5338* (2013.01)

(58) Field of Classification Search
None
See application file for complete search history.

(56) References Cited

U.S. PATENT DOCUMENTS

| 8,859,306 B2 | 10/2014 | Seo et al. |
| 9,305,984 B2 | 4/2016 | Kang |

(Continued)

FOREIGN PATENT DOCUMENTS

| KR | 10-1065318 | 9/2011 |
| KR | 10-2015-0052645 | 5/2015 |

(Continued)

OTHER PUBLICATIONS

A. G. Macdiarmid et al., "The concept of 'doping' of conducting polymers: the role of reduction potentials", Philosophical Transactions of the Royal Society of London. Series A, Mathematical and Physical Sciences, May 1985, pp. 3-15, vol. 314.

*Primary Examiner* — J. E. Schoenholtz
(74) *Attorney, Agent, or Firm* — Kile Park Reed & Houtteman PLLC

(57) ABSTRACT

A method of manufacturing a display apparatus includes forming a first substrate on a support substrate; forming a first barrier layer on the first substrate; and forming a conductive layer by implanting n-type impurities or p-type impurities in the first barrier layer and at least a portion of the first substrate. A display apparatus includes a conductive layer arranged on a substrate and a barrier layer arranged on the conductive layer. The conductive layer is doped with n-type impurities when the first barrier layer is doped with n-type impurities, and the conductive layer is doped with p-type impurities when the first barrier layer is doped with p-type impurities.

22 Claims, 15 Drawing Sheets

(56) References Cited

U.S. PATENT DOCUMENTS

| | | |
|---|---|---|
| 10,109,695 B2 | 10/2018 | Choi et al. |
| 2003/0141506 A1 | 7/2003 | Sano et al. |
| 2005/0227422 A1* | 10/2005 | Nakamura ........ H01L 29/78663 |
| | | 257/E29.151 |
| 2019/0074276 A1 | 3/2019 | Huh et al. |
| 2019/0319050 A1 | 10/2019 | Jeong et al. |

FOREIGN PATENT DOCUMENTS

| | | |
|---|---|---|
| KR | 10-2017-0037786 | 4/2017 |
| KR | 10-2019-0027984 | 3/2019 |
| KR | 10-2019-0119700 | 10/2019 |

\* cited by examiner

DISPLAY APPARATUS WITH DOPED BARRIER AND CONDUCTIVE LAYERS AND METHOD OF MANUFACTURING THE SAME

CROSS-REFERENCE TO RELATED APPLICATION(S)

This application claims priority to and benefits of Korean Patent Application No. 10-2020-0043605 under 35 U.S.C. § 119, filed on Apr. 9, 2020, in the Korean Intellectual Property Office, the entire contents of which are incorporated herein by reference.

BACKGROUND

1. Technical Field

One or more embodiments relate to a display apparatus and a method of manufacturing the same, and, to a display apparatus with improved reliability and a method of manufacturing the same.

2. Description of the Related Art

Recently, usage of display apparatuses has diversified. As display apparatuses have become thinner and lighter, their range of use has gradually been extended. Among display apparatuses, a portable slim and flat panel flexible display apparatus is in the limelight. A flexible display apparatus is generally lightweight and resistant against impacts, and may be folded or rolled for storing purposes. Therefore, the flexible display apparatus has excellent portability.

However, in the case where a display apparatus according to the related art uses a substrate including a polymer resin, polarization occurs to the polymer resin and an afterimage may be viewed.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments include a display apparatus in which an afterimage is prevented from being viewed and simultaneously reliability is improved by arranging a conductive layer between a substrate including a polymer resin and a barrier layer, and a method of manufacturing the same. However, it should be understood that embodiments described herein should be considered in a descriptive sense only and not for limitation of the disclosure.

Additional aspects will be set forth in part in the description which follows and, in part, will be apparent from the description, or may be learned by practice of the presented embodiments of the disclosure.

According to one or more embodiments, a display apparatus may include a first substrate; a conductive layer arranged on the first substrate and doped with n-type impurities or p-type impurities; and a first barrier layer arranged on the conductive layer and doped with n-type impurities or p-type impurities, wherein, the conductive layer may be doped with n-type impurities when the first barrier layer is doped with n-type impurities, and the conductive layer may be doped with p-type impurities when the first barrier layer is doped with p-type impurities.

The n-type impurities may include one of phosphorous, fluorine, and nitrogen.

The p-type impurities may include one of boron, argon, and hydrogen.

The first barrier layer may have a first thickness from a top surface of the conductive layer in a range of about 4,000 Å to about 6,000 Å.

The first barrier layer may include amorphous silicon.

The display apparatus may further include: a second substrate arranged below the first substrate; and a second barrier layer arranged between the second substrate and the first substrate.

The first substrate and the second substrate may include a same material.

The display apparatus may further include: a pixel circuit arranged over the first substrate and including a thin film transistor and a storage capacitor; and an organic light-emitting diode electrically connected to the pixel circuit.

The display apparatus may further include: a third barrier layer arranged on the first barrier layer.

The first barrier layer may have a second thickness from a top surface of the conductive layer, and the third barrier layer may have a third thickness from a top surface of the first barrier layer, the third thickness may be greater than the second thickness.

The second thickness may be in a range of about 1,000 Å to about 2,000 Å, and the third thickness may be in a range of about 3,000 Å to about 4,000 Å.

According to one or more embodiments, a method of manufacturing a display apparatus may include forming a first substrate on a support substrate; forming a first barrier layer on the first substrate; and forming a conductive layer by implanting n-type impurities or p-type impurities in the first barrier layer and at least a portion of the first substrate.

The forming of the conductive layer may include doping at least a portion of the first substrate with n-type impurities or p-type impurities.

The doping of the at least a portion of the first substrate may include doping the at least a portion of the first substrate with n-type impurities when the first barrier layer is doped with n-type impurities, and doping the at least a portion of the first substrate with p-type impurities when the first barrier layer is doped with p-type impurities.

The forming of the conductive layer may include implanting the n-type impurities or the p-type impurities may be implanted in the first barrier layer and the at least a portion of the first substrate by using ion implantation or plasma treatment.

The forming of the conductive layer may include implanting the n-type impurities or the p-type impurities may be implanted in the first barrier layer and the at least a portion of the first substrate at an acceleration voltage in a range of about 70 KeV to about 80 KeV.

The method may further include heat-treating the first barrier layer and the conductive layer after the forming of the conductive layer.

The forming of the first barrier layer may include forming the first barrier layer to have a first thickness from a top surface of the first substrate in a range of about 4,000 Å to about 6,000 Å.

The method may further include forming a second substrate on the support substrate before the forming of the first substrate on the support substrate; and forming a second barrier layer on the second substrate.

The method may further include forming a third barrier layer on the first barrier layer after the forming of the conductive layer.

The forming of the first barrier layer may include forming the first barrier layer to have a second thickness from a top surface of the first substrate in a range of about 1000 Å to about 2000 Å.

The forming of the third barrier layer may include forming the third barrier layer to have a third thickness from a top surface of the first barrier layer in a range of about 3000 Å to about 4000 Å.

The forming of the conductive layer may include doping the at least a portion of the first substrate with n-type impurities or p-type impurities, and implanting the n-type impurities or the p-type impurities in the first barrier layer and the at least a portion of the first substrate at an acceleration voltage of about 30 KeV or less.

These and/or other aspects will become apparent and more readily appreciated from the following description of the embodiments, the accompanying drawings, and claims.

BRIEF DESCRIPTION OF THE DRAWINGS

The above and other aspects, features, and advantages of embodiments of the disclosure will be more apparent from the following description taken in conjunction with the accompanying drawings, in which.

DETAILED DESCRIPTION OF THE EMBODIMENTS

Figure 1:
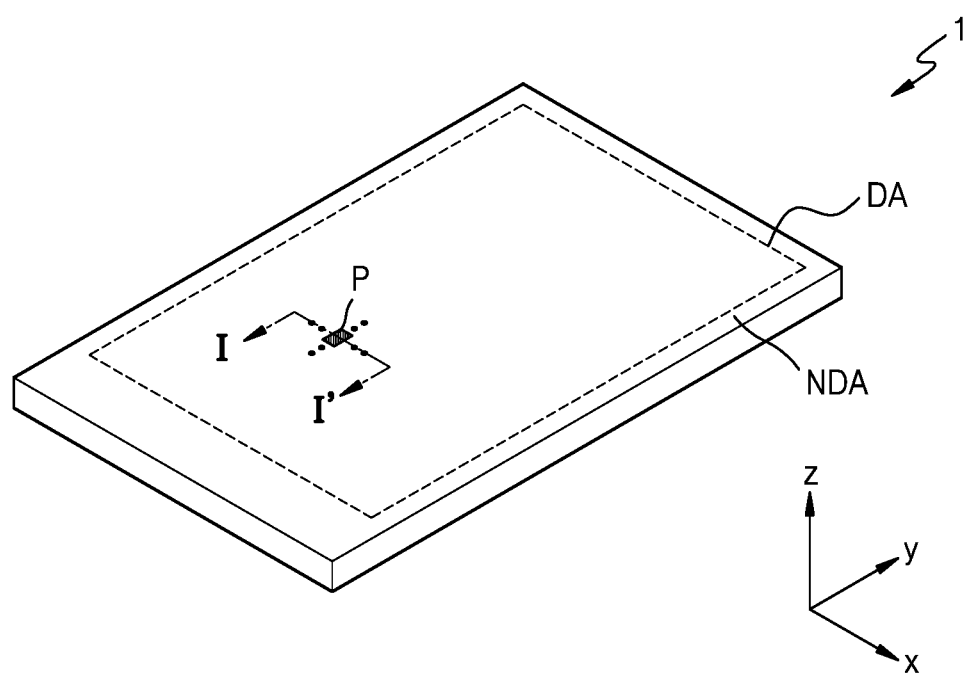
FIG. 1 is a perspective view of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

As the disclosure allows for various changes and numerous embodiments, embodiments will be illustrated in the drawings and described in detail in the written description. Effects and characteristics of the disclosure, and a method of accomplishing the same will become apparent and more readily appreciated from the following description of the embodiments and the accompanying drawings. However, the disclosure is not limited to embodiments below and may be implemented in various forms.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well, unless the context clearly indicates otherwise.

It will be further understood that the terms "comprises" and/or "comprising", "have" and/or "having", "includes" and/or "including" used herein specify the presence of stated features or components, but do not preclude the presence or addition of one or more other features or components.

When a layer, film, region, substrate, or area, or element is referred to as being "on" another layer, film, region, substrate, or area, or element, it may be directly on the other film, region, substrate, or area, or element, or intervening films, regions, substrates, or areas, or elements may be present therebetween. Conversely, when a layer, film, region, substrate, or area, or element, is referred to as being "directly on" another layer, film, region, substrate, or area, or element, intervening layers, films, regions, substrates, or areas, may be absent therebetween. Further when a layer, film, region, substrate, or area, or element, is referred to as being "below" another layer, film, region, substrate, or area, or element, it may be directly below the other layer, film, region, substrate, or area, or element, or intervening layers, films, regions, substrates, or areas, or elements, may be present therebetween. Conversely, when a layer, film, region, substrate, or area, or element, is referred to as being "directly below" another layer, film, region, substrate, or area, or element, intervening layers, films, regions, substrates, or areas, or elements may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Sizes of elements in the drawings may be exaggerated or reduced for convenience of explanation. In other words, since sizes and thicknesses of components in the drawings are arbitrarily illustrated for convenience of explanation, the following embodiments are not limited thereto.

In the specification, "A and/or B" means A or B, or A and B. In the specification, "at least one of A and B" means A or B, or A and B.

As used herein, when a wiring is referred to as "extending in a first direction or a second direction", it means that the wiring not only extends in a straight line shape but also extends in a zigzag or a curve in the first direction or the second direction.

As used herein, "in plan view" means that an object is viewed from above, and "in schematic cross-sectional view" means that a vertical cross-section of an object is viewed from a side. As used herein, "overlap" includes both overlapping both "in plan view" and "in schematic cross-sectional view".

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

It will be understood that when a layer, region, or component is referred to as being "connected" or "coupled" to another layer, region, or component, it may be "directly connected" or "directly coupled" to the other layer, region, or component and/or may be "indirectly connected" or "indirectly coupled" to the other layer, region, or component with other layers, regions, or components interposed therebetween. For example, it will be understood that when a layer, region, or component is referred to as being "electrically connected" to another layer, region, or component, it may be "directly electrically connected" to the other layer, region, or component and/or may be "indirectly electrically connected" to the other layer, region, or component with other layers, regions, or components interposed therebetween.

Also, when an element is referred to as being "in contact" or "contacted" or the like to another element, the element may be in "electrical contact" or in "physical contact" with another element; or in "indirect contact" or in "direct contact" with another element.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that may not be perpendicular to one another.

Unless otherwise defined, all terms (including technical and scientific terms) used herein have the same meaning as commonly understood by one of ordinary skill in the art to which embodiments pertain. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, embodiments are described in detail with reference to the accompany drawings. When description is made with reference to the drawings, like reference numerals are given to like or corresponding elements.

FIG. 1 is a perspective view of a display apparatus 1 according to an embodiment.

Referring to FIG. 1, the display apparatus 1 may include a display area DA and a non-display area NDA, the non-display area NDA being outside the display area DA. The non-display area NDA may surround or be adjacent to the display area DA. The display apparatus 1 may display an image by using light emitted from pixels P arranged or disposed in the display area DA. The non-display area NDA may be a region on which an image may not be displayed.

Hereinafter, though an organic light-emitting display apparatus is described as the display apparatus 1 as an example, the display apparatus according to an embodiment is not limited thereto. In an embodiment, the display apparatus 1 according to an embodiment may include inorganic light-emitting display apparatuses and quantum-dot light-emitting display apparatuses. For example, an emission layer of a display element of the display apparatus 1 may include an organic material, an inorganic material, quantum dots, an organic material and quantum dots, or an inorganic material and quantum dots.

Although it is shown in FIG. 1 that the display apparatus 1 may include a flat display surface, the embodiment is not limited thereto. In an embodiment, the display apparatus 1 may include a three-dimensional display surface or a curved display surface.

In the case where the display apparatus 1 may include a three-dimensional display surface, the display apparatus 1 may include display areas indicating different directions, for example, that may include a substantially polygonal column display surface. In an embodiment, in the case where the display apparatus 1 may include a curved display surface, the display apparatus 1 may be implemented as various types such as flexible, foldable, and rollable display apparatuses.

FIG. 1 shows the display apparatus 1 applicable to a mobile terminal. Although not shown, electronic modules, camera modules, power modules, or the like mounted or disposed on a mainboard may be arranged or disposed in a bracket/case together with the display apparatus 1 to configure or form a mobile terminal. As an example, the display apparatus 1 according to an embodiment may be applicable to not only large-scale electronic apparatuses such as televisions and monitors, but may also be applicable to small and medium-scale electronic apparatuses such as table personal computers, vehicle navigation apparatuses, game consoles, and smartwatches.

Although FIG. 1 shows the case in which the display area DA of the display apparatus 1 may be substantially quadrangular, however, the shape of the display area DA is not limited thereto and may be a circle, an ellipse, or a polygon such as a triangle or a pentagon.

The display apparatus 1 may include pixels P arranged or disposed in the display area DA. Each of the pixels P may include an organic light-emitting diode OLED. Each of the pixels P may emit, for example, red, green, blue, or white light through an organic light-emitting diode OLED. In the specification, as described above, the pixel P may be understood as a pixel emitting red, green, blue, or white light.

Figure 2:
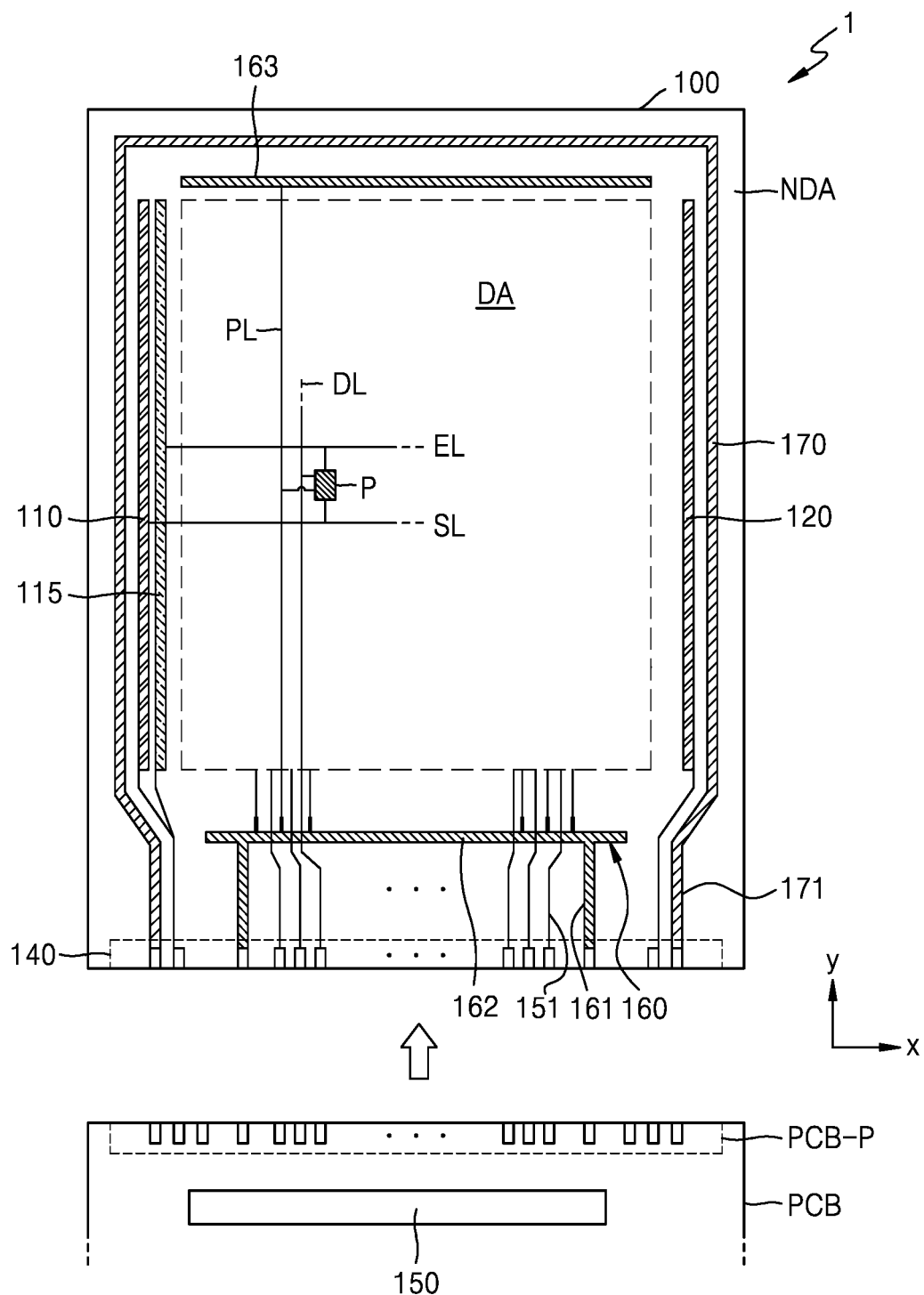
FIG. 2 is a plan view of a display apparatus according to an embodiment.

FIG. 2 is a plan view of the display apparatus 1 according to an embodiment.

Referring to FIG. 2, the display apparatus 1 may include pixels P arranged or disposed in the display area DA. Each of the pixels P may include a display element such as an organic light-emitting diode OLED. Each of the pixels P may emit, for example, red, green, blue, or white light through an organic light-emitting diode OLED. In the specification, as described above, the pixel P may be understood as a pixel emitting red, green, blue, or white light.

Each pixel P may be electrically connected to outer circuits arranged or disposed in the non-display area NDA. A first scan driving circuit 110, a first emission driving circuit 115, a second scan driving circuit 120, a terminal 140, a data driving circuit 150, a first power supply line 160, and a second power supply line 170 may be arranged or disposed in the non-display area NDA.

The first scan driving circuit 110 may provide a scan signal to each pixel P through a scan line SL. The first emission driving circuit 115 may provide an emission control signal to each pixel P through an emission control line EL. The second scan driving circuit 120 may be arranged or disposed in parallel to the first scan driving circuit 110 with the display area DA therebetween. Some or a predetermined number of the pixels P arranged or disposed in the display area DA may be electrically connected to the first scan driving circuit 110, and the rest or a remainder of the pixels P may be electrically connected to the second scan driving circuit 120. In an embodiment, the second scan driving circuit 120 may be omitted.

The first emission driving circuit 115 may be spaced apart from the first scan driving circuit 110 in an x direction and arranged or disposed in the non-display area NDA. The first emission driving circuit 115 may be alternately arranged or disposed with the first scan driving circuit 110 in a y direction.

The terminal 140 may be arranged or disposed on one or a side of a second substrate 100. The terminal 140 may be exposed and electrically connected to a printed circuit board PCB by not being covered or overlapped by an insulating layer. A terminal PCB-P of the printed circuit board PCB may be electrically connected to the terminal 140 of the display apparatus 1. The printed circuit board PCB may transfer a signal or power of a controller (not shown) to the display apparatus 1. A control signal generated by the controller may be transferred to the first scan driving circuit 110, the first emission driving circuit 115, and the second scan driving circuit 120 through the printed circuit board PCB. The controller may respectively provide first power voltage ELVDD and second power voltage ELVSS to the first power supply line 160 and the second power supply line 170 through a first connection line 161 and a second connection line 171. The first power voltage ELVDD may be provided to the pixel P through a driving voltage line PL electrically connected to the first power supply line 160, and the second power voltage ELVSS may be provided to an opposite electrode of the pixel P electrically connected to the second power supply line 170.

The data driving circuit 150 may be electrically connected to the data line DL. A data signal of the data driving circuit 150 may be provided to each pixel P through a connection line 151 and the data line DL, the connection line 151 being electrically connected to the terminal 140, and the data line DL being electrically connected to the connection line 151.

Although it is shown in FIG. 2 that the data driving circuit 150 may be arranged or disposed on the printed circuit board PCB, the data driving circuit 150 may be arranged or disposed on the second substrate 100 in an embodiment. For example, the data driving circuit 150 may be arranged or disposed between the terminal 140 and the first power supply line 160.

The first power supply line 160 may include a first sub-line 162 and a second sub-line 163, the first sub-line 162 and the second sub-line 163 extending in the x direction in parallel to each other with the display area DA therebetween. The second power supply line 170 may have a loop shape with one or an open side and may partially surround or may be adjacent to the display area DA.

Figure 3:
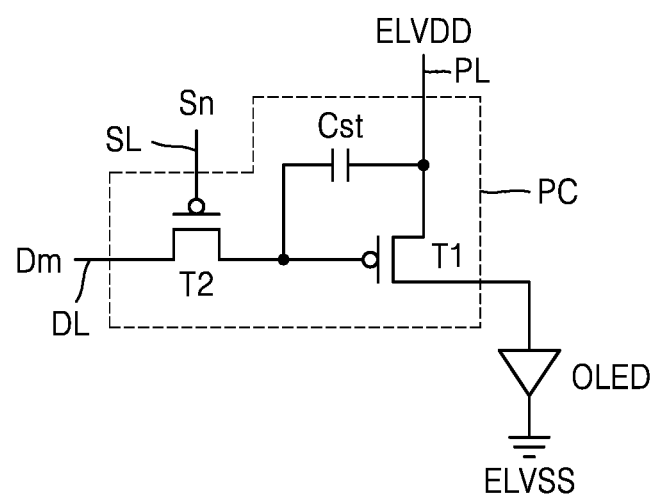
FIGS. 3 and 4 are equivalent circuit diagrams of a pixel that may be included in a display apparatus according to an embodiment.
Figure 4:
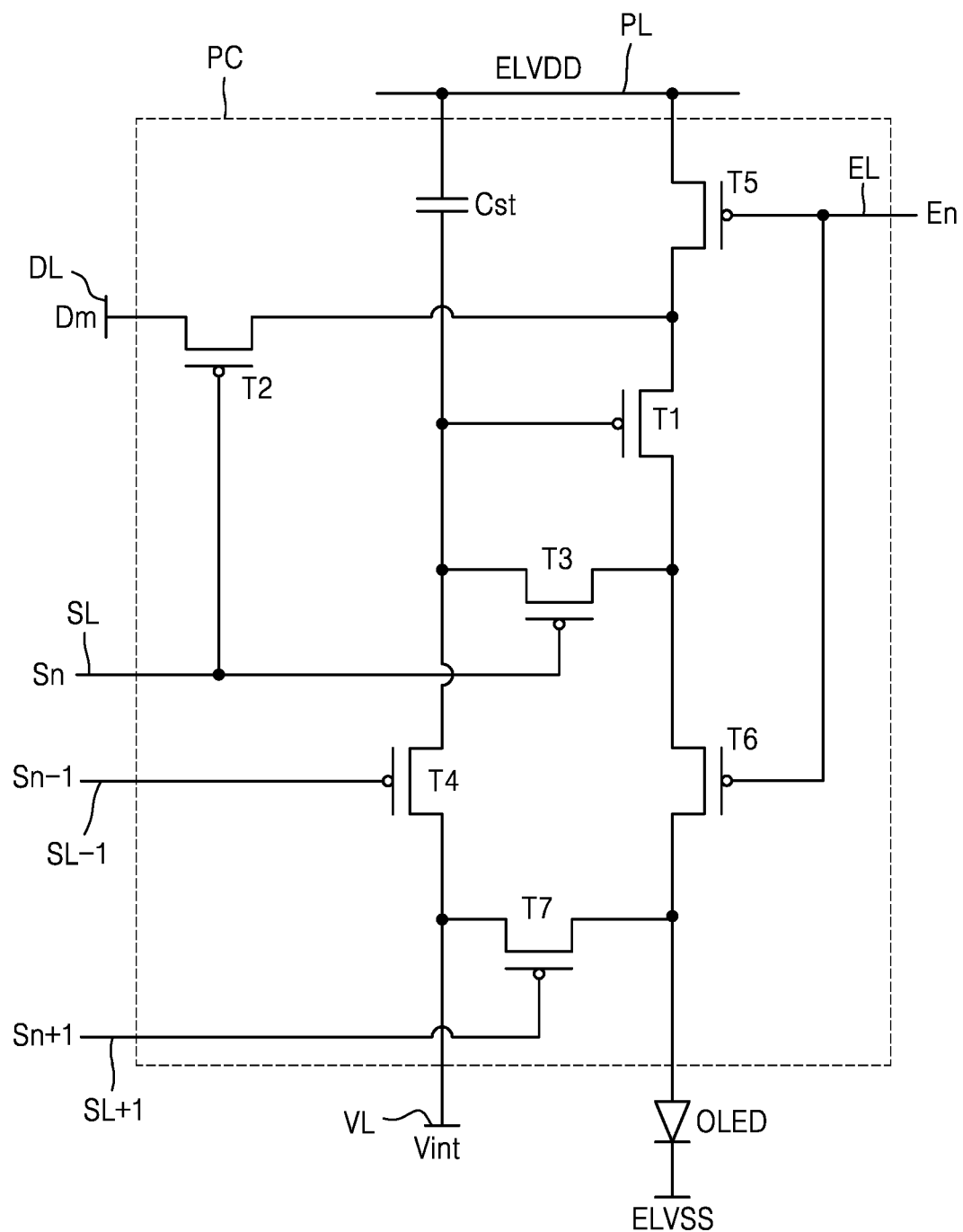

FIGS. 3 and 4 are equivalent circuit diagrams of a pixel that may be included in the display apparatus 1 according to an embodiment.

Referring to FIG. 3, a pixel circuit PC may be electrically connected to an organic light-emitting diode OLED to implement light emission of pixels. The pixel circuit PC may include a driving thin film transistor T1, a switching thin film transistor T2, and a storage capacitor Cst. The switching thin film transistor T2 may be electrically connected to the scan line SL and the data line DL and may transfer a data signal Dm input from the data line DL to the driving thin film transistor T1 based on a scan signal Sn input from the scan line SL.

The storage capacitor Cst may be electrically connected to the switching thin film transistor T2 and the driving voltage line PL and may store a voltage corresponding to a difference between a voltage transferred from the switching thin film transistor T2 and the first power voltage ELVDD supplied to the driving voltage line PL.

The driving thin film transistor T1 may be electrically connected between the driving voltage line PL and the storage capacitor Cst and may control a driving current flowing through the organic light-emitting diode OLED from the driving voltage line PL in response to the voltage stored in the storage capacitor Cst. The organic light-emitting diode OLED may emit light having a predetermined brightness by using the driving current.

Although FIG. 3 describes the case where the pixel circuit PC may include two thin film transistors and one storage capacitor, an embodiment is not limited thereto.

Referring to FIG. 4, the pixel circuit PC may include the driving thin film transistor T1, the switching thin film transistor T2, a compensation thin film transistor T3, a first initialization thin film transistor T4, an operation control thin film transistor T5, an emission control thin film transistor T6, a second initialization thin film transistor T7, and a storage capacitor Cst.

Although it is shown in FIG. 4 that each pixel circuit PC may include signal lines SL, SL−1, SL+1, EL, and DL, an initialization voltage line VL, a driving voltage line PL, the embodiment is not limited thereto. In an embodiment, at least one of the signal lines SL, SL−1, SL+1, EL, and DL, and/or the initialization voltage line VL may be shared by neighboring pixel circuits.

A drain electrode of the driving thin film transistor T1 may be electrically connected to the organic light-emitting diode OLED through the emission control thin film transistor T6. The driving thin film transistor T1 may receive a data signal Dm depending on a switching operation of the switching thin film transistor T2 and may supply a driving current to the main organic light-emitting diode OLED.

A gate electrode of the switching thin film transistor T2 may be electrically connected to the scan line SL, and a source electrode of the switching thin film transistor T2 may be electrically connected to the data line DL. A drain electrode of the switching thin film transistor T2 may be electrically connected to the source electrode of the driving thin film transistor T1 and simultaneously may be electrically connected to the driving voltage line PL through the operation control thin film transistor T5.

The switching thin film transistor T2 may be turned on in response to a scan signal Sn transferred through the scan line SL and may perform a switching operation of transferring a data signal Dm transferred through the data line DL to the source electrode of the driving thin film transistor T1.

A gate electrode of the compensation thin film transistor T3 may be electrically connected to the scan line SL. A source electrode of the compensation thin film transistor T3 may be electrically connected to the drain electrode of the driving thin film transistor T1 and simultaneously may be electrically connected to a pixel electrode of the organic light-emitting diode OLED through the emission control thin film transistor T6. A drain electrode of the compensation thin film transistor T3 may be simultaneously electrically connected to one of electrodes of the storage capacitor Cst, the source electrode of the first initialization thin film transistor T4, and the gate electrode of the driving thin film transistor T1. The compensation thin film transistor T3 may be turned on in response to a scan signal Sn transferred through the scan line SL and may diode-connect the driving thin film transistor T1 by electrically connecting the gate electrode of the driving thin film transistor T1 to the drain electrode of the driving thin film transistor T1.

A gate electrode of the first initialization thin film transistor T4 may be electrically connected to the previous scan line SL−1. A drain electrode of the first initialization thin film transistor T4 may be electrically connected to the initialization voltage line VL. A source electrode of the first initialization thin film transistor T4 may be simultaneously electrically connected to one of the electrodes of the storage capacitor Cst, the drain electrode of the compensation thin film transistor T3, and the gate electrode of the driving thin film transistor T1. The first initialization thin film transistor T4 may be turned on in response to a previous scan signal Sn−1 transferred through the previous scan line SL−1 and may perform an initialization operation of initializing a voltage of the gate electrode of the driving thin film transistor T1 by transferring an initialization voltage Vint to the driving gate electrode of the driving thin film transistor T1.

A gate electrode of the operation control thin film transistor T5 may be electrically connected to the emission control line EL. A source electrode of the operation control thin film transistor T5 may be electrically connected to the driving voltage line PL. A drain electrode of the operation control thin film transistor T5 may be electrically connected to the source electrode of the driving thin film transistor T1, and the drain electrode of the switching thin film transistor T2.

A gate electrode of the emission control thin film transistor T6 may be electrically connected to the emission control line EL. A source electrode of the emission control thin film transistor T6 may be electrically connected to the drain electrode of the driving thin film transistor T1 and the source electrode of the compensation thin film transistor T3. A drain electrode of the emission control thin film transistor T6 may be electrically connected to the pixel electrode of the organic light-emitting diode OLED. The operation control thin film transistor T5 and the emission control thin film transistor T6 may be simultaneously turned on in response to an emission control signal En transferred through the emission control line EL, the first power voltage ELVDD may be transferred to the organic light-emitting diode OLED, and the driving current may flow through the organic light-emitting diode OLED.

A gate electrode of the second initialization thin film transistor T7 may be electrically connected to the next scan line SL+1. A source electrode of the second initialization thin film transistor T7 may be electrically connected to the pixel electrode of the organic light-emitting diode OLED. A drain electrode of the second initialization thin film transistor T7 may be electrically connected to the initialization voltage line VL. The second initialization thin film transistor T7 may be turned on in response to a scan signal Sn+1 transferred through the next scan line SL+1 to initialize the pixel electrode of the organic light-emitting diode OLED.

Although it is shown in FIG. 4 that the first initialization thin film transistor T4 and the second initialization thin film transistor T7 may be respectively electrically connected to the previous scan line SL−1 and the next scan line SL+1, an embodiment is not limited thereto. In an embodiment, both the first initialization thin film transistor T4 and the second initialization thin film transistor T7 may be electrically connected to the previous scan line SL−1 and thus driven in response to a previous scan signal Sn−1.

The other electrode of the storage capacitor Cst may be electrically connected to the driving voltage line PL. One electrode of the storage capacitor Cst may be simultaneously electrically connected to the gate electrode of the driving thin film transistor T1, the drain electrode of the compensation thin film transistor T3, and the source electrode of the first initialization thin film transistor T4.

An opposite electrode (for example, a cathode) of the organic light-emitting diode OLED may receive the second power voltage ELVSS. The organic light-emitting diode OLED may emit light by receiving the driving current from the driving thin film transistor T1.

The pixel circuit PC is not limited to the number of thin film transistors, the number of storage capacitors, and a circuit design described with reference to FIG. 4, and the number of thin film transistors, the number of storage capacitors, and the circuit design may be variously changed without departing from the spirit and the scope of the disclosure.

Figure 5:
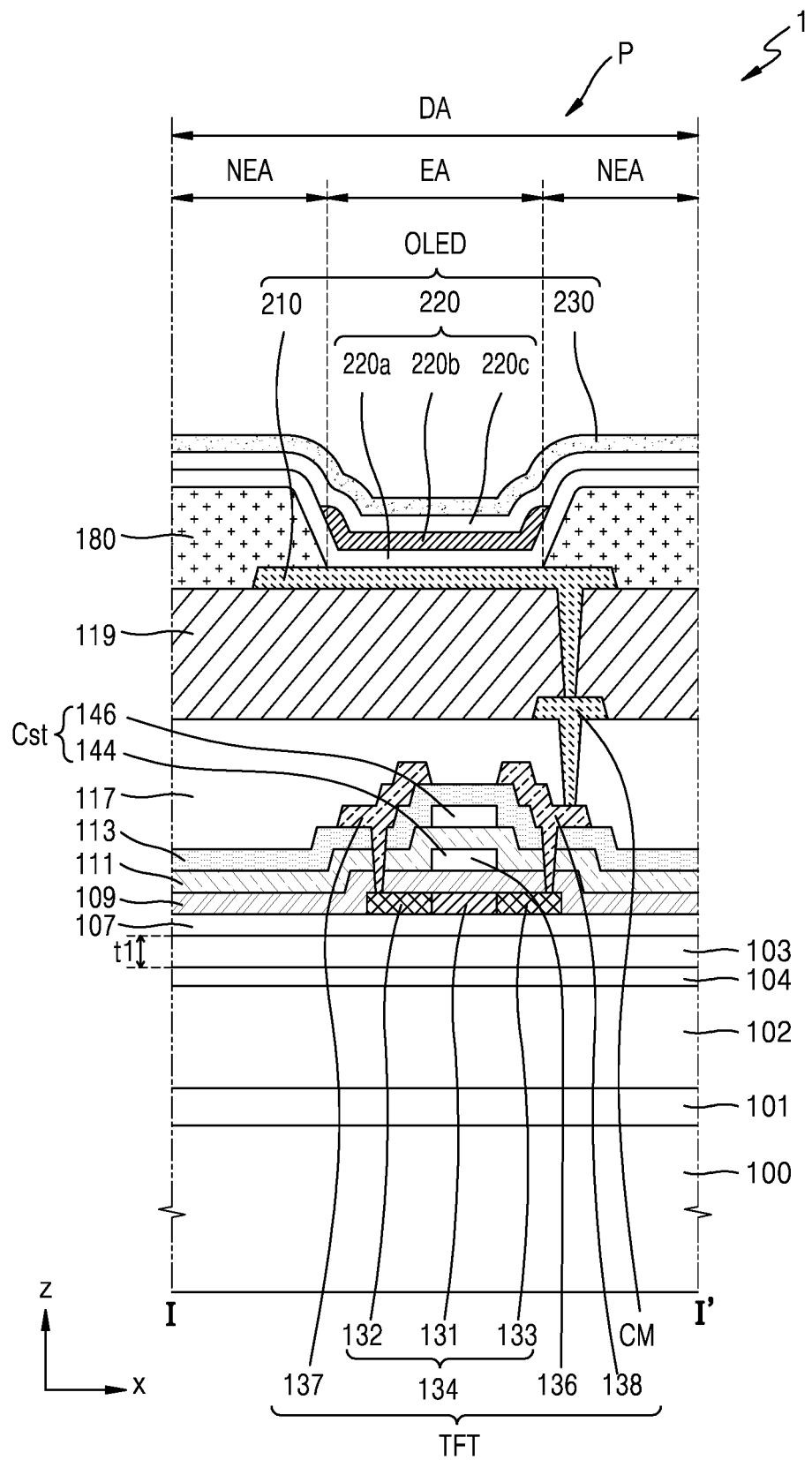
FIG. 5 is a schematic cross-sectional view of a display apparatus according to an embodiment.

FIG. 5 is a schematic cross-sectional view of the display apparatus 1 according to an embodiment. For example, FIG. 5 is a schematic cross-sectional view of a portion of the display apparatus 1 according to an embodiment.

Referring to FIG. 5, a display element may be arranged or disposed over a first substrate 102. The display element may include a thin film transistor TFT and an organic light-emitting diode OLED.

The first substrate 102 may include a polymer resin. The polymer resin may include polyethersulfone, polyacrylate, polyetherimide, polyethylene naphthalate, polyethylene terephthalate, polyphenylene sulfide, polyarylate, polyimide, polycarbonate, or cellulose acetate propionate. The first substrate 102 including the polymer resin may be flexible, rollable, or bendable. For example, the first substrate 102 may include polyimide.

A first barrier layer 103 may be arranged or disposed over the first substrate 102. The first barrier layer 103 may be arranged or disposed over the first substrate 102 and doped with n-type impurities or p-type impurities. In an embodiment, the first barrier layer 103 may be doped with n-type impurities or p-type impurities by using ion implantation or plasma treatment. The n-type impurities may include one of phosphorous, fluorine, and nitrogen, and the p-type impurities may include one of boron, argon, and hydrogen.

The first barrier layer 103 may include an inorganic material such as an oxide or a nitride, an organic material, or an organic/inorganic composite material, and may have a single-layered structure or a multi-layered structure including an inorganic material and an organic material. For example, the first barrier layer 103 may include amorphous silicon.

A conductive layer 104 may be arranged or disposed between the first substrate 102 and the first barrier layer 103. The conductive layer 104 may be arranged or disposed between the first substrate 102 and the first barrier layer 103 and doped with n-type impurities or p-type impurities. The conductive layer 104 may be directly arranged or disposed on the first substrate 102.

In an embodiment, the conductive layer 104 may be doped with n-type impurities or p-type impurities by using ion implantation or plasma treatment. The n-type impurities may include one of phosphorous, fluorine, and nitrogen, and the p-type impurities may include one of boron, argon, and hydrogen.

The conductive layer 104 may be a portion formed by doping at least a portion of the first substrate 102. As an example, the conductive layer 104 may be a portion formed by doping the first barrier layer 103 and at least a portion of the first substrate 102 after the first barrier layer 103 may be formed on the first substrate 102. Therefore, in a case that the first barrier layer 103 is doped with n-type impurities, the conductive layer 104 may be also doped with the n-type impurities, and in a case that the first barrier layer 103 is doped with p-type impurities, the conductive layer 104 may be also doped with the p-type impurities. For example, the first barrier layer 103 and the conductive layer 104 may be doped with the same or similar impurities.

The first barrier layer 103 may have a first thickness t1 from a top surface of the conductive layer 104 and be arranged or disposed on the conductive layer 104. In an embodiment, the first thickness t1 may be in a range of about 4000 Å to about 6000 Å.

The second substrate 100 may be arranged or disposed below the first substrate 102. A second barrier layer 101 may be arranged or disposed between the first substrate 102 and the second substrate 100. In an embodiment, the second substrate 100 may include the same or similar material as that of the first substrate 102. In an embodiment, the second substrate 100 may include a material different from that of the first substrate 102.

The second barrier layer 101 may be arranged or disposed on the second substrate 100. The second barrier layer 101 may include an inorganic material such as an oxide or a nitride, an organic material, or an organic/inorganic composite material, and may have a single-layered structure or a multi-layered structure including an inorganic material and an organic material. In an embodiment, the second barrier layer 101 may include the same or similar material as the first barrier layer 103. In an embodiment, the second barrier layer 101 may include a material different from that of the first barrier layer 103.

A buffer layer 107 may be arranged or disposed on the first barrier layer 103. The buffer layer 107 may be arranged or disposed over the first substrate 102 and the second substrate 100 to reduce or block foreign substances, moisture, or external air or other impurities from below the first substrate 102 and the second substrate 100 and provide a flat surface on the first substrate 102 and the second substrate 100. The buffer layer 107 may include an inorganic material such as an oxide or a nitride, an organic material, or an organic/inorganic composite material, and may have a single-layered structure or a multi-layered structure including an inorganic material and an organic material.

A thin film transistor TFT may be arranged or disposed on the buffer layer 107. The thin film transistor TFT may include a semiconductor layer 134, a gate electrode 136, and a connection electrode, the gate electrode 136 overlapping the semiconductor layer 134, and the connection electrode being electrically connected to the semiconductor layer 134. The thin film transistor TFT may be electrically connected to the organic light-emitting diode OLED to drive the organic light-emitting diode OLED.

The semiconductor layer 134 may include a channel region 131, a source region 132, and a drain region 133, the channel region 131 being arranged or disposed on the buffer layer 107 and overlapping the gate electrode 136, and the source region 132 and the drain region 133 being on two opposite sides of the channel region and being doped with impurities higher than the impurities of the channel region 131. Here, the impurities may include n-type impurities or p-type impurities. The source region 132 and the drain region 133 may be electrically connected to the connection electrode.

The semiconductor layer 134 may include an oxide semiconductor and/or a silicon semiconductor. In the case where the semiconductor layer 134 may include an oxide semiconductor, the semiconductor layer 134 may include, for example, an oxide of at least one of indium (In), gallium (Ga), stannum (Sn), zirconium (Zr), vanadium (V), hafnium (Hf), cadmium (Cd), germanium (Ge), chromium (Cr), titanium (Ti), and zinc (Zn). For example, the semiconductor layer 134 may include ITZO (InSnZnO) and IGZO (InGaZnO). In the case where the semiconductor layer 134 may include a silicon semiconductor, the semiconductor layer 134 may include amorphous silicon (a-Si) or low temperature polycrystalline silicon (LTPS).

A first insulating layer 109 may be arranged or disposed on the semiconductor layer 134. The first insulating layer 109 may include at least one inorganic insulating material among silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The first insulating layer 109 may include a single layer or a multi-layer including the above inorganic insulating material.

A gate electrode 136 may be arranged or disposed on the first insulating layer 109. The gate electrode 136 may include a single layer or a multi-layer including at least one metal among aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and/or copper (Cu). The gate electrode 136 may be electrically connected to a gate line that may apply an electric signal to the gate electrode 136.

A second insulating layer 111 may be arranged or disposed on the gate electrode 136. The second insulating layer 111 may include at least one inorganic insulating material among silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO$_2$). The second insulating layer 111 may include a single layer or a multi-layer including the above inorganic insulating material.

A storage capacitor Cst may be arranged or disposed on the first insulating layer 109. The storage capacitor Cst may include a bottom electrode 144 and a top electrode 146, the top electrode 146 overlapping the bottom electrode 144. The bottom electrode 144 may overlap the top electrode 146 of the storage capacitor Cst with the second insulating layer 111 therebetween.

The bottom electrode 144 of the storage capacitor Cst may overlap the gate electrode 136 of the thin film transistor TFT and be provided as one body with the gate electrode 136 of the thin film transistor TFT.

The top electrode 146 of the storage capacitor Cst may include a single layer or a multi-layer including at least one metal among aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and/or copper (Cu).

A third insulating layer 113 may be arranged or disposed on the top electrode 146 of the storage capacitor Cst. The third insulating layer 113 may include at least one inorganic insulating material among silicon oxide (SiO$_2$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), or zinc oxide (ZnO$_2$). The third insulating layer 113 may include a single layer or a multi-layer including the above inorganic insulating material.

A source electrode 137 and a drain electrode 138 may be arranged or disposed on the third insulating layer 113, the source electrode 137 and the drain electrode 138 being connection electrodes. The source electrode 137 and the drain electrode 138 may include a conductive material including Mo, Al, Cu, and Ti and may include a single layer or a multi-layer including the above materials. The source electrode 137 and the drain electrode 138 may have a multi-layered structure of Ti/Al/Ti.

A first planarization layer 117 may be arranged or disposed on the source electrode 137 and the drain electrode 138. The first planarization layer 117 may include a single layer or a multi-layer including an organic material or an inorganic material. In an embodiment, the first planarization layer 117 may include a general-purpose polymer such as benzocyclobutene (BCB), polyimide (PI), hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. The first planarization layer 117 may include silicon oxide (SiO$_2$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), or zinc oxide (ZnO$_2$). After the first planarization layer 117 is formed, chemical mechanical polishing may be performed to provide a flat top surface.

A contact metal CM may be arranged or disposed on the first planarization layer 117. The contact metal CM may include at least one of Al, Cu, and Ti and may include a single layer or a multi-layer. The contact metal CM may have a multi-layered structure of Ti/Al/Ti.

A second planarization layer 119 may be arranged or disposed on the contact metal CM. The second planarization layer 119 may include a single layer or a multi-layer including an organic material or an inorganic material. In an embodiment, the second planarization layer 119 may include the same or similar material as the first planarization layer 117. In an embodiment, the second planarization layer 119 may include a material different from that of the first planarization layer 117. After the second planarization layer 119 is formed, chemical mechanical polishing may be performed to provide a flat top surface. In an embodiment, the second planarization layer 119 may be omitted.

An organic light-emitting diode OLED may be arranged or disposed on the second planarization layer 119, the organic light-emitting diode OLED including a pixel electrode 210, an intermediate layer 220, and an opposite electrode 230. The pixel electrode 210 may be electrically connected to the contact metal CM through a contact hole passing through the second planarization layer 119. The contact metal layer CM may be electrically connected to the source electrode 137 or the drain electrode 138, which may be connection electrodes of the thin film transistor TFT, through a contact hole passing through the first planarization layer 117. Therefore, the organic light-emitting diode OLED may be electrically connected to the thin film transistor TFT.

The pixel electrode 210 may be arranged or disposed on the second planarization layer 119. The pixel electrode 210 may include a (semi) transparent electrode or a reflective electrode. The pixel electrode 210 may include a reflective layer and a transparent or semi-transparent electrode on the reflective layer, the reflective layer including at least one of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), copper (Cu), and a compound thereof. The transparent or semi-transparent electrode layer may include at least one of indium tin oxide (ITO), indium zinc oxide (IZO), zinc oxide (ZnO), indium oxide (In$_2$O$_3$), indium gallium oxide (IGO), and aluminum zinc oxide (AZO). The pixel electrode 210 may have a stacked structure of ITO/Ag/ITO.

A pixel-defining layer 180 may be arranged or disposed on the second planarization layer 119 and may include an opening that may expose at least a portion of the pixel electrode 210 of the pixel-defining layer 180. A region exposed by the opening of the pixel-defining layer 180 may be defined as an emission area EA. Surroundings of the emission area EA may be non-emission areas NEA. The non-emission areas NEA may surround or may be adjacent to the emission areas EA. For example, the display area DA may include emission areas EA and the non-emission areas NEA surrounding or adjacent to the emission areas EA. The pixel-defining layer 180 may prevent an arc, for example, from occurring at the edges of the pixel electrode 210 by increasing a distance between the pixel electrode 210 and the opposite electrode 230 over the pixel electrode 210. The pixel-defining layer 180 may include an organic insulating material including, for example, polyimide, polyamide, an acrylic resin, benzocyclobutene, HMDSO, and a phenolic resin and may be formed by using spin coating, for example, within the spirit and the scope of the disclosure.

An intermediate layer 220 may be arranged or disposed on a portion of the pixel electrode 210 that may be exposed by the pixel-defining layer 180. The intermediate layer 220 may include an emission layer 220b and may include a first functional layer 220a and a second functional layer 220c under or below and on the emission layer 220b.

In an embodiment, the intermediate layer 220 may be arranged or disposed on a portion of the pixel electrode 210 that may be exposed by the pixel-defining layer 180. As an example, the emission layer 220b of the intermediate layer 220 may be arranged or disposed on a portion of the pixel electrode 210 that may be exposed by the pixel-defining layer 180.

The first functional layer 220a may be arranged or disposed under or below the emission layer 220b, and the second functional layer 220c may be arranged or disposed on the emission layer 220b. The first functional layer 220a and the second functional layer 220c arranged or disposed under or below and on the emission layer 220b may be collectively referred to organic functional layers.

Although not illustrated, the first functional layer 220a may include a hole injection layer (HIL) and/or a hole transport layer (HTL). Although not illustrated, the second functional layer 220c may include an electron transport layer (ETL) and/or an electron injection layer (EIL).

The emission layer 220b may include an organic material including a fluorescent or phosphorous material emitting red, green, blue, or white light. The emission layer 220b may include a low molecular weight organic material or a polymer organic material.

In the case where the emission layer 220b may include a low molecular weight material, the emission layer 220b may have a structure in which a hole injection layer (HIL), a hole transport layer (HTL), an emission layer (EML), an electron transport layer (ETL), an electron injection layer (EIL), for example may be stacked in a single or composite configuration. The emission layer 220b may include, as the low molecular weight material, various organic materials such as copper phthalocyanine (CuPc), N,N'-Di (naphthalene-1-yl)-N,N'-diphenyl-benzidine (NPB), and tris-8-hydroxyquinoline aluminum (Alq3). These layers may be formed by vacuum deposition.

In the case where the emission layer 220b may include a polymer organic material, the intermediate layer 220 may have a structure generally including a hole transport layer and the emission layer 220b. In this case, the hole transport layer may include poly (3,4-ethylenedioxythiophene) (PEDOT), and the emission layer 220b may include a polymer material such as a polyphenylene vinylene (PPV)-based material and a polyfluorene-based material. The emission layer may be formed by using screen printing or inkjet printing, laser induced thermal imaging (LITI), for example, within the spirit and the scope of the disclosure.

The opposite electrode 230 may be arranged or disposed on the intermediate layer 220. The opposite electrode 230 may be arranged or disposed on the intermediate layer 220 and may entirely cover or overlap the intermediate layer 220. The opposite electrode 230 may be arranged or disposed over the display area DA and may entirely cover or overlap the display area DA. For example, the opposite electrode 230 may be formed as one body by using an open mask over the entire display area to cover or overlap the pixels P arranged or disposed in the display area DA.

The opposite electrode 230 may include a conductive material having a low work function. For example, the opposite electrode 230 may include a (semi)-transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy thereof. Alternatively, the opposite electrode 230 may include a layer on the (semi)-transparent layer including the above material, the layer including ITO, IZO, ZnO, or $In_2O_3$.

In an embodiment, the organic light-emitting diode OLED may be covered or overlapped by a thin-film encapsulation layer. The thin-film encapsulation layer may include at least one inorganic encapsulation layer and at least one organic encapsulation layer. In an embodiment, the organic light-emitting diode OLED may be covered or overlapped by an encapsulation substrate.

Figure 6:
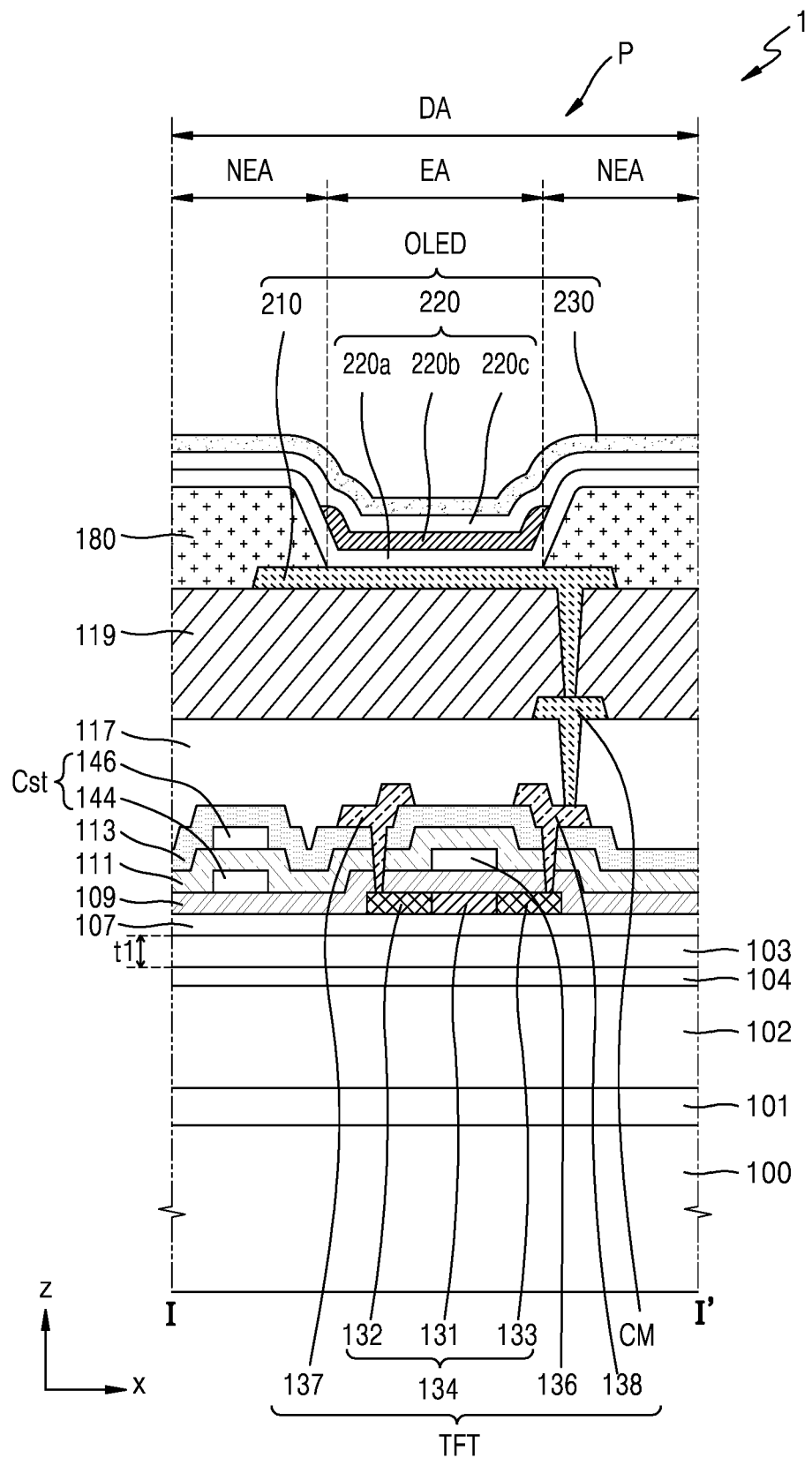
FIG. 6 is a schematic cross-sectional view of a display apparatus according to an embodiment.

FIG. 6 is a schematic cross-sectional view of the display apparatus 1 according to an embodiment. The embodiment of FIG. 6 may be different from an embodiment of FIG. 5 in that the bottom electrode may be provided as an independent element separately from the gate electrode. Hereinafter, differences are mainly described. Other configurations may be similar to those of the above embodiment.

Referring to FIG. 6, the display apparatus according to an embodiment may include the storage capacitor Cst. The storage capacitor Cst may not overlap the thin film transistor TFT.

The storage capacitor Cst may include the bottom electrode 144 and the top electrode 146 over the bottom electrode 144. Different from the above embodiment, the bottom electrode 144 of the storage capacitor Cst may not overlap the gate electrode 136 of the thin film transistor TFT and may be arranged or disposed as a separate independent element on the first insulating layer 109.

Figure 7:
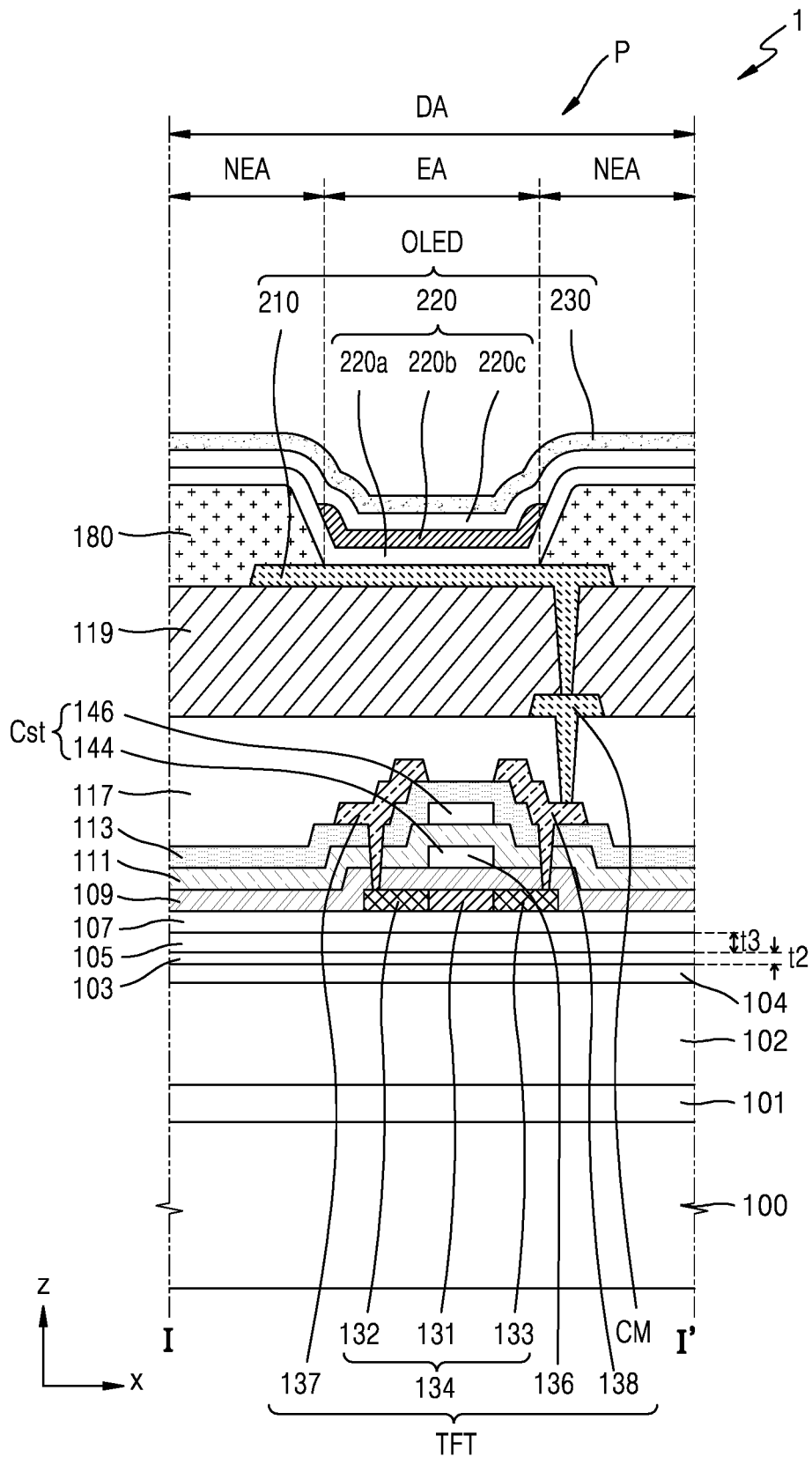
FIG. 7 is a schematic cross-sectional view of a display apparatus according to an embodiment.

FIG. 7 is a schematic cross-sectional view of the display apparatus 1 according to an embodiment. The embodiment of FIG. 7 may be different from an embodiment of FIG. 5 in the thickness of the first barrier layer 103 and in that a barrier layer 105 may be arranged or disposed on the first barrier layer 103. Hereinafter, differences are mainly described. Other configurations may be the same as or similar to those of the above embodiment.

Referring to FIG. 7, the first barrier layer 103 may be arranged or disposed over the first substrate 102, the third barrier layer 105 may be arranged or disposed on the first barrier layer 103, and the conductive layer 104 may be arranged or disposed between the first substrate 102 and the first barrier layer 103.

The first barrier layer 103 may be arranged or disposed over the first substrate 102. The first barrier layer 103 may be arranged or disposed over the first substrate 102 and doped with n-type impurities or p-type impurities. In an embodiment, the first barrier layer 103 may be doped with n-type impurities or p-type impurities by using ion implantation or plasma treatment.

The conductive layer 104 may be arranged or disposed between the first substrate 102 and the first barrier layer 103. The conductive layer 104 may be arranged or disposed between the first substrate 102 and the first barrier layer 103 and doped with n-type impurities or p-type impurities. The conductive layer 104 may be directly arranged or disposed on the first substrate 102.

The conductive layer 104 may be a portion formed by doping at least a portion of the first substrate 102. As an example, the conductive layer 104 may be a portion formed by doping at least a portion of the first substrate 102, the first barrier layer 103 and the at least a portion of the first substrate 102 being doped after the first barrier layer 103 may be formed or disposed on the first substrate 102. Therefore, in the case where the first barrier layer 103 is doped with n-type impurities, the conductive layer 104 may be also doped with the n-type impurities. In the case where the first barrier layer 103 may be doped with p-type impurities, the conductive layer 104 may be also doped with the p-type impurities. For example, the first barrier layer 103 and the conductive layer 104 may be doped with the same or similar impurities.

The first barrier layer 103 may be arranged or disposed on the conductive layer 104 and may have a second thickness t2 from a top surface of the conductive layer 104. In an embodiment, the second thickness t2 may be in a range of about 500 Å to about 3000 Å.

In the case where the first barrier layer 103 is provided thin, the inside of a chamber may be contaminated by a gas generated from the inside of the substrate during a process. In the case where the first barrier layer 103 is provided thick, a high acceleration voltage may be required to dope at least a portion of the first substrate 102. Therefore, the second thickness t2 may be in a range of about 1000 Å to about 2000 Å.

The third barrier layer 105 may be arranged or disposed on the first barrier layer 103. The third barrier layer 105 may have a third thickness t3 from a top surface of the first barrier layer 103 and be arranged or disposed on the first barrier layer 103. In an embodiment, the third thickness t3 may be in a range of about 2500 Å to about 4500 Å.

In the case where the third barrier layer 105 is provided thin, the inside of the chamber may be contaminated by a gas generated from the inside of the substrate during a process. In the case where the third barrier layer 105 is provided thick, a material cost may increase. Therefore, the third thickness t3 may be in a range of about 3000 Å to about 4000 Å.

The third barrier layer 105 may include an inorganic material such as an oxide or a nitride, an organic material, or an organic/inorganic composite material and may have a single-layered structure or a multi-layered structure of an inorganic material and an organic material. For example, the first barrier layer 103 may be doped with n-type impurities or p-type impurities, but the third barrier layer 105 may be arranged or disposed on the first barrier layer 103 without being doped with n-type impurities or p-type impurities.

FIGS. 8 to 11B are schematic cross-sectional views showing a method of manufacturing a display apparatus according to an embodiment.

Hereinafter, the method of manufacturing the display apparatus is sequentially described with reference to FIGS. 8 to 11B.

The method of manufacturing the display apparatus according to an embodiment may include forming the first substrate 102 over a support substrate 5, forming the first barrier layer 103 on the first substrate 102, and forming the conductive layer 104 by implanting n-type impurities or p-type impurities in the first barrier layer 103 and at least a portion of the first substrate 102.

The method of manufacturing the display apparatus according to an embodiment may include, before the forming of the first substrate 102 over the support substrate 5, forming the second substrate 100 on the support substrate 5, and forming the second barrier layer 101 on the second substrate 100.

Figure 8:
FIGS. 8 to 11B are schematic cross-sectional views showing a method of manufacturing a display apparatus according to an embodiment.

First, referring to FIG. 8, the forming of the second substrate 100 on the support substrate 5 may be performed. The second substrate 100 may include a polymer resin. The second substrate 100 including the polymer resin may be flexible, rollable, or bendable. For example, the second substrate 100 may include polyimide.

Figure 9:
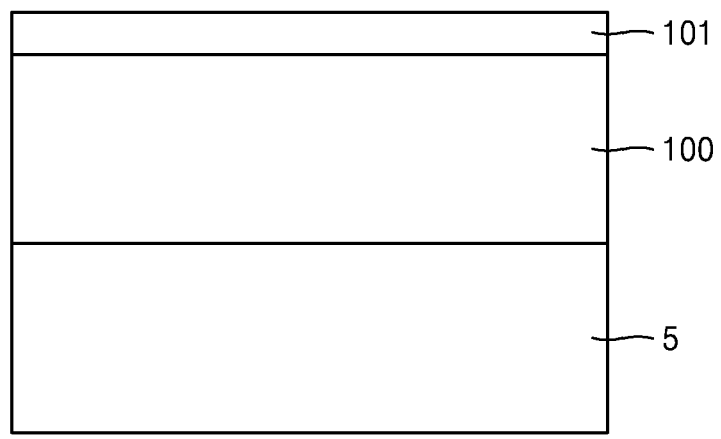

Referring to FIG. 9, after the forming of the second substrate 100 on the support substrate 5, the forming of the second barrier layer 101 on the second substrate 100 may be performed. The second barrier layer 101 may include an inorganic material such as an oxide or a nitride, an organic material, or an organic/inorganic composite material and may have a single-layered structure or a multi-layered structure of an inorganic material and an organic material.

Figure 10:
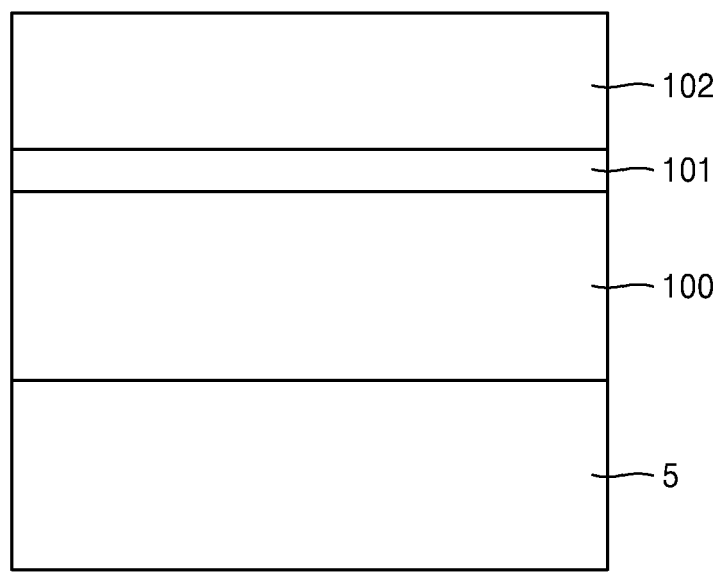

Referring to FIG. 10, after the forming of the second barrier layer 101 on the second substrate 100, forming the first substrate 102 on the second barrier layer 101 may be performed. In an embodiment, the first substrate 102 may include the same or similar material as that of the second substrate 100. In an embodiment, the first substrate 102 may include a material different from that of the second substrate 100.

Figure 11A:
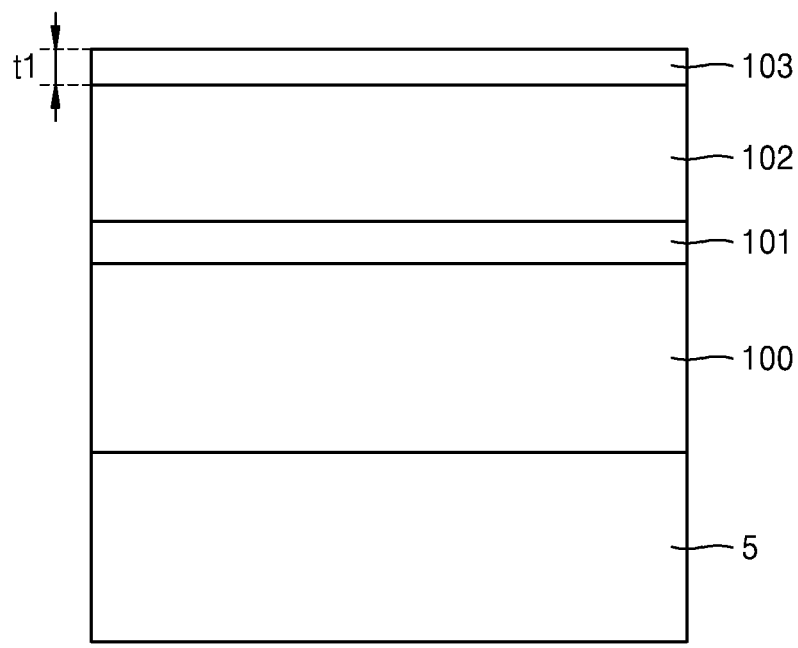

Referring to FIG. 11A, after the forming of the first substrate 102 on the second barrier layer 101, forming the first barrier layer 103 on the first substrate 102 may be performed. As an example, after the forming of the first substrate 102 on the second barrier layer 101, forming the first barrier layer 103 having the first thickness t1 from a top surface of the first substrate 102 on the first substrate 102 may be performed.

The first barrier layer 103 may have the first thickness t1 from the top surface of the first substrate 102. In an embodiment, the first thickness t1 may be in a range of about 4000 Å to about 6000 Å.

The first barrier layer 103 may include an inorganic material such as an oxide or a nitride, an organic material, or an organic/inorganic composite material and may have a single-layered structure or a multi-layered structure of an inorganic material and an organic material. For example, the first barrier layer 103 may include amorphous silicon. In an embodiment, the first barrier layer 103 may include the same or similar material as that of the second barrier layer 101. In an embodiment, the first barrier layer 103 may include a material different from that of the second barrier layer 101.

Figure 11B:
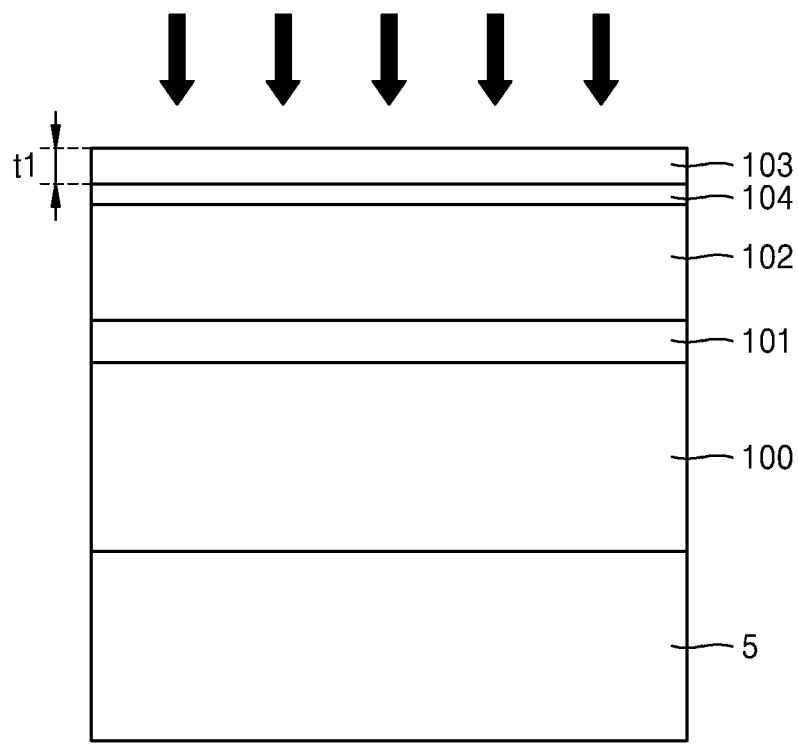

Referring to FIG. 11B, after the forming of the first barrier layer 103 over the first substrate 102, forming conductive layer 104 by implanting n-type impurities or p-type impurities in the first barrier layer 103 and at least a portion of the first substrate 102 may be performed.

In the case where the substrate may include a polymer resin, polarization is generated to the polymer resin by bias of wrings arranged or disposed on the substrate, a threshold voltage shift may change depending on the bias due to charge caused by the generated polarization, and thus an element characteristic may become different and a brightness difference may occur between pixels.

In the case where amorphous silicon doped with n-type impurities is deposited on the substrate by using chemical vapor deposition (CVD) to prevent polarization from being generated to the polymer resin by the bias of the wirings on the substrate, crosstalk may occur. In the case of forming polycrystalline silicon on the substrate and then forming the conductive layer, a process tact time may increase and crosstalk may occur. In the case of directly doping at least a portion of the substrate by using ion implantation, the inside of the chamber may be contaminated by a gas generated from the polymer resin of the substrate.

To resolve the above issues, an embodiment may prevent polarization from being generated to the polymer resin by bias of the wirings on the substrate and may simultaneously prevent an afterimage from being viewed by forming the barrier layer on the substrate including the polymer resin, and doping at least a portion of the substrate through ion implantation to form the conductive layer.

In the forming of the conductive layer 104 by implanting n-type impurities or p-type impurities in the first barrier layer 103 and at least a portion of the first substrate 102, the first barrier layer 103 and at least a portion of the first substrate 102 may be doped by implanting n-type impurities or p-type impurities in the top surface of the first barrier layer 103 through ion implantation, for example, the first barrier layer 103 being formed with a thickness of in a range of about 4000 Å to about 6000 Å on the first substrate 102.

The conductive layer 104 may be a portion formed by doping at least a portion of the first substrate 102 with n-type impurities or p-type impurities.

In the case where the first barrier layer 103 is formed or disposed on the first substrate 102 with a thickness in a range of about 4000 Å to about 6000 Å, n-type impurities or p-type impurities may be implanted in the first barrier layer 103 and at least a portion of the first substrate 102 with an acceleration voltage in a range of about 70 KeV to about 80 KeV. n-type impurities or p-type impurities implanted in the top surface of the first barrier layer 103 may pass through the first barrier layer 103 and dope at least a portion of the first substrate 102. In the case of implanting n-type impurities or p-type impurities in the top surface of the first barrier layer 103 with about 70 KeV, about 1.5% to about 2.5% of total impurities may be implanted in the first substrate 102 under or below the first barrier layer 103 to dope at least a portion of the first substrate 102. In the case of implanting n-type impurities or p-type impurities in the top surface of the first barrier layer 103 with about 80 KeV, about 8% to about 12% of total impurities may be implanted in the first substrate 102 under or below the first barrier layer 103 to dope at least a portion of the first substrate 102. For example, in the case of implanting n-type impurities or p-type impurities in the first barrier layer 103 and at least a portion of the first substrate 102 with an acceleration voltage of about 80 KeV, in a case that the total amount of implanted impurities may be about $1\times10^{23}$ ion/cm$^3$, impurities implanted in the first substrate 102 may be in a range of about $1\times10^{21}$ ion/cm$^3$ to about $1\times10^{22}$ ion/cm$^3$.

N-type impurities may include one of phosphorous, fluorine, and nitrogen, and p-type impurities may include one of boron, argon, and hydrogen.

Since at least a portion of the first substrate 102 may be doped with n-type impurities or p-type impurities and thus the conductive layer 104 may be formed, polarization may be prevented from being generated to the polymer resin by bias of the wirings on the substrate. Therefore, the reliability of an element may be improved, and simultaneously, an afterimage may be prevented from being viewed.

After the forming of the conductive layer 104 by implanting n-type impurities or p-type impurities in the first barrier layer 103 and at least a portion of the first substrate 102, heat-treatment of the first barrier layer 103 and the conductive layer 104 may be performed. The impurities implanted in the first barrier layer 103 and the conductive layer 104 may be activated by performing heat-treatment of the first barrier layer 103 and the conductive layer 104. Alternatively, since a process of heat-treating the semiconductor layer is performed afterwards, the heat-treating of the first barrier layer 103 and the conductive layer 104 may be omitted.

After the heat-treating of the first barrier layer 103 and the conductive layer 104, forming a display element on the first barrier layer 103 may be performed, the element including a thin film transistor and an organic light-emitting diode.

Figure 12A:
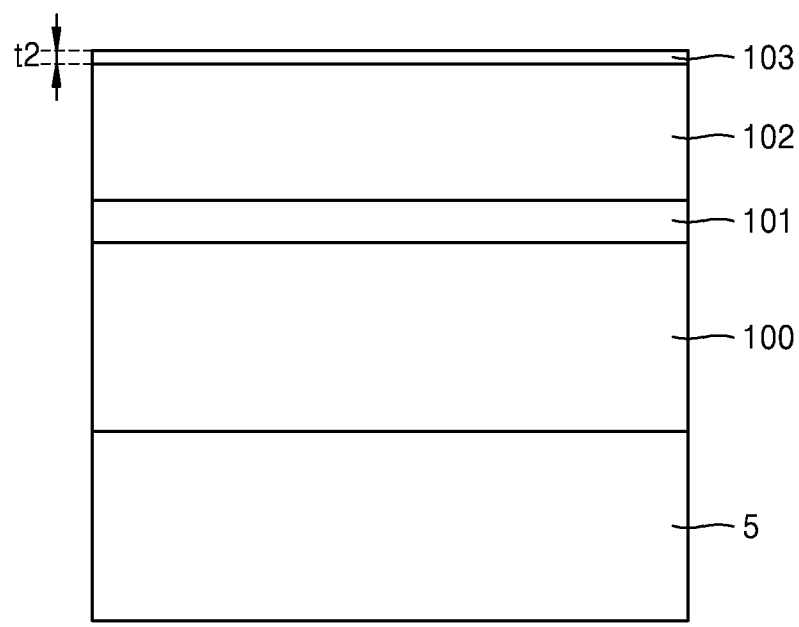
FIGS. 12A to 12C are schematic cross-sectional views for explaining a method of manufacturing a display apparatus according to an embodiment.
Figure 12B:
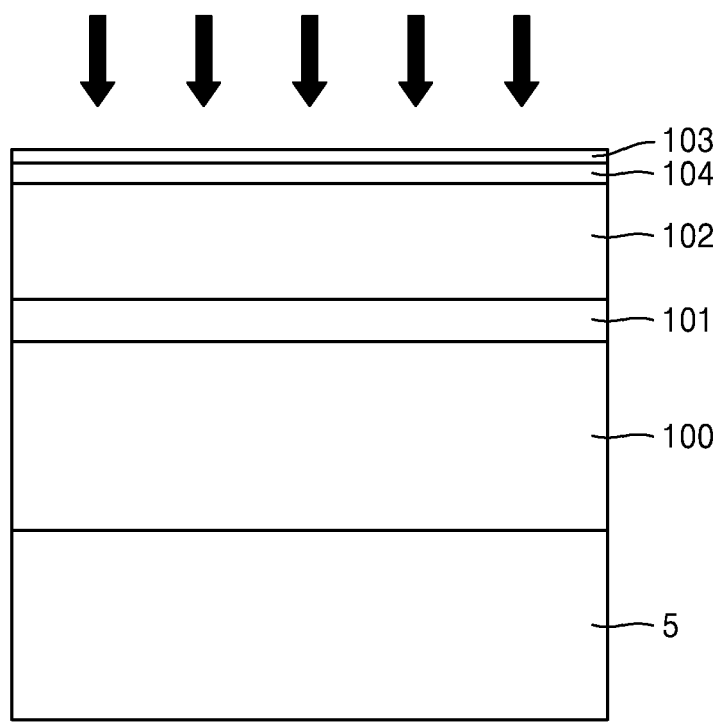
Figure 12C:
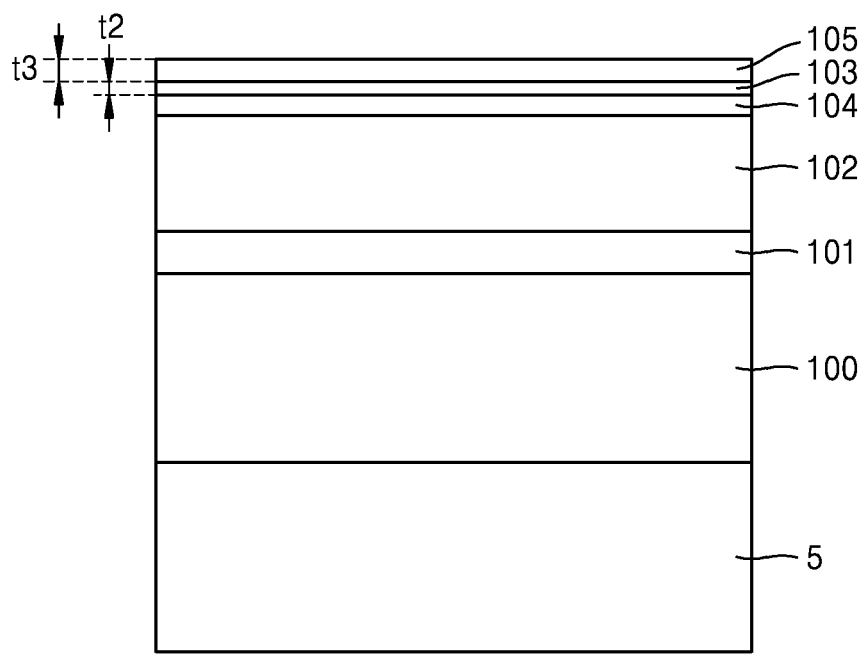

FIGS. 12A to 12C are schematic cross-sectional views showing the method of manufacturing the display apparatus according to an embodiment. The embodiment of FIGS. 12A to 12C may be a modified embodiment of FIGS. 11A and 11B and may be different from the above embodiment in that the first barrier layer may be arranged or disposed thin and the third barrier layer may be formed or disposed on the first barrier layer. Hereinafter, differences are mainly described. Other configurations may be the same as or similar to those of the above embodiment.

Referring to FIG. 12A, after the forming of the first substrate 102 on the second barrier layer 101, forming the first barrier layer 103 on the first substrate 102 may be performed. As an example, after the forming of the first substrate 102 on the second barrier layer 101, forming the first barrier layer 103 on the first substrate 102 may be performed, the first barrier layer 103 having the second thickness t2 from the top surface of the first substrate 102.

The first barrier layer 103 may have the second thickness t2 from the top surface of the first substrate 102. In an embodiment, the second thickness t2 may be in a range of about 500 Å to about 3000 Å.

The first barrier layer 103 may include an inorganic material such as an oxide or a nitride, an organic material, or an organic/inorganic composite material and may have a single-layered structure or a multi-layered structure of an inorganic material and an organic material. For example, the first barrier layer 103 may include amorphous silicon.

Referring to FIG. 12B, after the forming of the first barrier layer 103 on the first substrate 102, forming the conductive layer 104 by implanting n-type impurities or p-type impurities in the first barrier layer 103 and at least a portion of the first substrate 102 may be performed. As an example, after the forming of the first barrier layer 103 having the thickness in a range of about 1000 Å to about 2000 Å on the first substrate 102, the forming of the conductive layer 104 by implanting n-type impurities or p-type impurities in the first barrier layer 103 and at least a portion of the first substrate 102 may be performed.

In the forming of the conductive layer 104 by implanting n-type impurities or p-type impurities in the first barrier layer 103 and at least a portion of the first substrate 102, the first barrier layer 103 and at least a portion of the first substrate 102 may be doped by implanting n-type impurities or p-type impurities in the top surface of the first barrier layer 103 through ion implantation, for example, the first barrier layer 103 being formed with a thickness in a range of about 1000 Å to about 2000 Å on the first substrate 102. The conductive layer 104 may be a portion formed by doping at least a portion of the first substrate 102 with n-type impurities or p-type impurities.

In the case where the first barrier layer 103 may be formed or disposed on the first substrate 102 with a thickness in a range of about 1000 Å to about 2000 Å, n-type impurities or p-type impurities may be implanted in the first barrier layer 103 and at least a portion of the first substrate 102 with a lower acceleration voltage than the case where the first barrier layer 103 may be formed on the first substrate 102 with the thickness in a range of about 4000 Å to about 6000 Å. For example, in the case where the first barrier layer 103 is formed on the first substrate 102 with a thickness in a range of about 1000 Å to about 2000 Å, n-type impurities or p-type impurities may be implanted in the first barrier layer 103 and at least a portion of the first substrate 102 with an acceleration voltage less than about 30 KeV. N-type impurities or p-type impurities implanted in the top surface of the first barrier layer 103 may pass through the first barrier layer 103 and dope at least a portion of the first substrate 102. For example, in the case of implanting n-type impurities or p-type impurities in the top surface of the first barrier layer 103 having a thickness of about 1000 Å with about 30 KeV, about 60% to about 80% of total impurities may be implanted in the first substrate 102 under or below the first barrier layer 103 to dope at least a portion of the first substrate 102. In the case of implanting n-type impurities or p-type impurities in the top surface of the first barrier layer 103 having a thickness of about 2000 Å with about 30 KeV, about 5% to about 15% of total impurities may be implanted in the first substrate 102 under or below the first barrier layer 103 to dope at least a portion of the first substrate 102. Therefore, in the case where the first barrier layer 103 may be formed or disposed on the first substrate with a thickness in a range of about 1000 Å to about 2000 Å, the conductive layer 104 may be formed by implanting n-type impurities or p-type impurities in at least a portion of the first substrate 102 under or below the first barrier layer 103 with a lower acceleration voltage, for example, 30 keV or less than an acceleration voltage used in the case where the first barrier layer 103 is formed on the first substrate with a thickness in a range of about 4000 Å to about 6000 Å, and doping at least a portion of the first substrate 102.

Referring to FIG. 12C, after the forming of the conductive layer 104 by implanting n-type impurities or p-type impurities in the first barrier layer 103 and at least a portion of the first substrate 102, forming the third barrier layer 105 on the first barrier layer 103 may be further performed.

Referring to FIGS. 11B and 12B, in the case where the first barrier layer 103 is provided thin, impurities may be implanted in the substrate with a low acceleration voltage. However, in the case where the barrier layer formed or disposed on the substrate including a polymer resin is provided thin, since the barrier layer may not sufficiently protect the substrate and the elements, the third barrier layer 105 may be formed or disposed on the second barrier layer 103 as shown in FIG. 12C.

The third barrier layer 105 may have the third thickness t3 from the top surface of the first barrier layer 103, the third thickness t3 being greater than the second thickness t2. In an embodiment, the third thickness t3 may be in a range of about 2500 Å to about 4500 Å.

Since a process of implanting n-type impurities or p-type impurities in the third barrier layer 105 is not performed, the third barrier layer 105 may be formed or disposed on the first barrier layer 103 without being doped with n-type impurities or p-type impurities.

Since the third barrier layer 105 is formed or disposed on the first barrier layer 103, even in the case of forming the conductive layer 104 by implanting impurities in at least a portion of the substrate with a low acceleration voltage, the substrate, the elements, for example, may be protected.

According to an embodiment, since the conductive layer may be arranged or disposed between the substrate and the barrier layer, an afterimage may be prevented from being viewed, and simultaneously, a display apparatus and a method of manufacturing the same in which the reliability of a product may be improved may be implemented. However, the scope of the disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a first substrate;
a conductive layer arranged on the first substrate doped with n-type impurities or p-type impurities;
a first barrier layer arranged on the conductive layer and doped with n-type impurities or p-type impurities; and
a semiconductor layer arranged on the first barrier layer, wherein
the conductive layer is doped with n-type impurities when the first barrier layer is doped with n-type impurities,
the conductive layer is doped with p-type impurities when the first barrier layer is doped with p-type impurities, and
the n-type impurities include one of phosphorous, fluorine, and nitrogen.

2. The display apparatus of claim 1, wherein the p-type impurities include one of boron, argon, and hydrogen.

3. The display apparatus of claim 1, wherein the first barrier layer has a first thickness from a top surface of the conductive layer in a range of about 4,000 Å to about 6,000 Å.

4. A display apparatus comprising:
a first substrate;
a conductive layer arranged on the first substrate and doped with n-type impurities or p-type impurities; and
a first barrier layer arranged on the conductive layer and doped with n-type impurities or p-type impurities, wherein
the conductive layer is doped with n-type impurities when the first barrier layer is doped with n-type impurities,
the conductive layer is doped with p-type impurities when the first barrier layer is doped with p-type impurities, and
the first barrier layer includes amorphous silicon.

5. A display apparatus comprising:
a first substrate;
a conductive layer arranged on the first substrate and doped with n-type impurities or p-type impurities;
a first barrier layer arranged on the conductive layer and doped with n-type impurities or p-type impurities;
a second substrate arranged below the first substrate; and
a second barrier layer arranged between the second substrate and the first substrate, wherein
the conductive layer is doped with n-type impurities when the first barrier layer is doped with n-type impurities,
the conductive layer is doped with p-type impurities when the first barrier layer is doped with p-type impurities.

6. The display apparatus of claim 5, wherein the first substrate and the second substrate include a same material.

7. The display apparatus of claim 1, further comprising:
a pixel circuit arranged over the first substrate and including a thin film transistor and a storage capacitor; and
an organic light-emitting diode electrically connected to the pixel circuit.

8. The display apparatus of claim 5, further comprising:
a third barrier layer arranged on the first barrier layer.

9. The display apparatus of claim 8, wherein
the first barrier layer has a second thickness from a top surface of the conductive layer, and
the third barrier layer has a third thickness from a top surface of the first barrier layer, the third thickness being greater than the second thickness.

10. The display apparatus of claim 9, wherein
the second thickness is in a range of about 1,000 Å to about 2,000 Å, and
the third thickness is in a range of about 3,000 Å to about 4,000 Å.

11. A method of manufacturing a display apparatus, the method comprising:
forming a first substrate on a support substrate;
forming a first barrier layer on the first substrate; and forming a conductive layer by implanting n-type impurities or p-type impurities in the first barrier layer and at least a portion of the first substrate.

12. The method of claim 11, wherein the forming of the conductive layer comprises doping at least a portion of the first substrate with n-type impurities or p-type impurities.

13. The method of claim 12, wherein the doping of the at least a portion of the first substrate comprises:
doping the at least a portion of the first substrate with n-type impurities when the first barrier layer is doped with n-type impurities, and
doping the at least a portion of the first substrate with p-type impurities when the first barrier layer is doped with p-type impurities.

14. The method of claim 12, wherein the forming of the conductive layer comprises implanting the n-type impurities or the p-type impurities in the first barrier layer and the at least a portion of the first substrate by using ion implantation or plasma treatment.

15. The method of claim 14, wherein the forming of the conductive layer comprises implanting the n-type impurities or the p-type impurities in the first barrier layer and the at least a portion of the first substrate at an acceleration voltage in a range of about 70 KeV to about 80 KeV.

16. The method of claim 11, further comprising heat-treating the first barrier layer and the conductive layer after the forming of the conductive layer.

17. The method of claim 11, wherein the forming of the first barrier layer comprises forming the first barrier layer to have a first thickness from a top surface of the first substrate in a range of about 4,000 Å to about 6,000 Å.

18. The method of claim 11, further comprising:
forming a second substrate on the support substrate before the forming of the first substrate on the support substrate; and
forming a second barrier layer on the second substrate.

19. The method of claim 18, further comprising forming a third barrier layer on the first barrier layer after the forming of the conductive layer.

20. The method of claim 19, wherein the forming of the first barrier layer comprises forming the first barrier layer to have a second thickness from a top surface of the first substrate in a range of about 1,000 Å to about 2,000 Å.

21. The method of claim 20, wherein the forming of the third barrier layer comprises forming the third barrier layer to have a third thickness from a top surface of the first barrier layer in a range of about 3,000 Å to about 4,000 Å.

22. The method of claim 21, wherein
the forming of the conductive layer includes doping the at least a portion of the first substrate with n-type impurities or p-type impurities, and
implanting the n-type impurities or the p-type impurities in the first barrier layer and the at least a portion of the first substrate at an acceleration voltage of about 30 KeV or less.

* * * * *